(12) United States Patent
Jaso (10) Patent No.: US 6,811,657 B2
(45) Date of Patent: Nov. 2, 2004

(54) DEVICE FOR MEASURING THE PROFILE OF A METAL FILM SPUTTER DEPOSITION TARGET, AND SYSTEM AND METHOD EMPLOYING SAME

(75) Inventor: Mark A. Jaso, Fairfax Station, VA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/352,699

(22) Filed: Jan. 27, 2003

(65) Prior Publication Data

US 2004/0144638 A1 Jul. 29, 2004

(51) Int. Cl.$^7$ .................... C23C 14/34; G01N 17/00
(52) U.S. Cl. .................. 204/192.13; 204/298.03; 73/86
(58) Field of Search .................. 204/298.03, 192.13; 73/86

(56) References Cited

U.S. PATENT DOCUMENTS

| | | | |
|---|---|---|---|
| 4,374,722 A | 2/1983 | Zega | 204/298 |
| 4,407,708 A | 10/1983 | Landau | 204/192 R |
| 4,545,882 A | 10/1985 | McKelvey | 204/192 R |
| 4,894,132 A | 1/1990 | Tanaka | 204/192.13 |
| 4,957,605 A | 9/1990 | Hurwitt et al. | 204/192.12 |
| 4,983,269 A | 1/1991 | Wegmann | 204/192.13 |
| 5,380,419 A | 1/1995 | Eggers et al. | 204/298.03 |
| 5,534,997 A | 7/1996 | Schrader | 356/301 |
| 5,540,821 A | 7/1996 | Tepman | 204/192.13 |
| 5,719,495 A | 2/1998 | Moslehi | 324/158.1 |
| 5,858,464 A | 1/1999 | Littau et al. | 427/237 |
| 6,008,888 A | 12/1999 | Nottke et al. | 356/71 |
| 6,390,019 B1 | 5/2002 | Grimbergen et al. | 118/723 R |
| 6,416,635 B1 | 7/2002 | Hurwitt et al. | 204/192.13 |
| 6,421,132 B1 | 7/2002 | Brajovic | 356/602 |
| 6,480,265 B2 | 11/2002 | Maimon et al. | 356/4.07 |
| 6,486,948 B1 | 11/2002 | Zeng | 356/301 |

Primary Examiner—Steven VerSteeg
(74) Attorney, Agent, or Firm—TraskBritt (57) ABSTRACT

An apparatus and method for measuring the erosion profile of a metallic target in a sputtering device are provided by inserting a thin sensor into a gap between the target and a substrate pedestal. The sensor is configured to emit an energy beam toward the surface of the target and detect a reflection of the energy beam. The sensor may comprise a source element configured to emit a collimated light beam and a plurality of detectors arranged in a linear array. The sensor may also comprise optical fibers configured to reduce the size of the sensor. The detectors are positioned relative to the source element so that one of the detectors in the array will be illuminated by a reflection of the collimated light beam. The distance from the sensor to the target may be derived from the position of the detector illuminated by the reflected beam.

43 Claims, 4 Drawing Sheets

DEVICE FOR MEASURING THE PROFILE OF A METAL FILM SPUTTER DEPOSITION TARGET, AND SYSTEM AND METHOD EMPLOYING SAME

BACKGROUND OF THE INVENTION

1. Field of the Invention

The present invention relates generally to sputter deposition on substrate surfaces. More specifically, the present invention relates to methods and apparatus for measuring the profile of a sputtering target.

2. State of the Art

Figure 1:
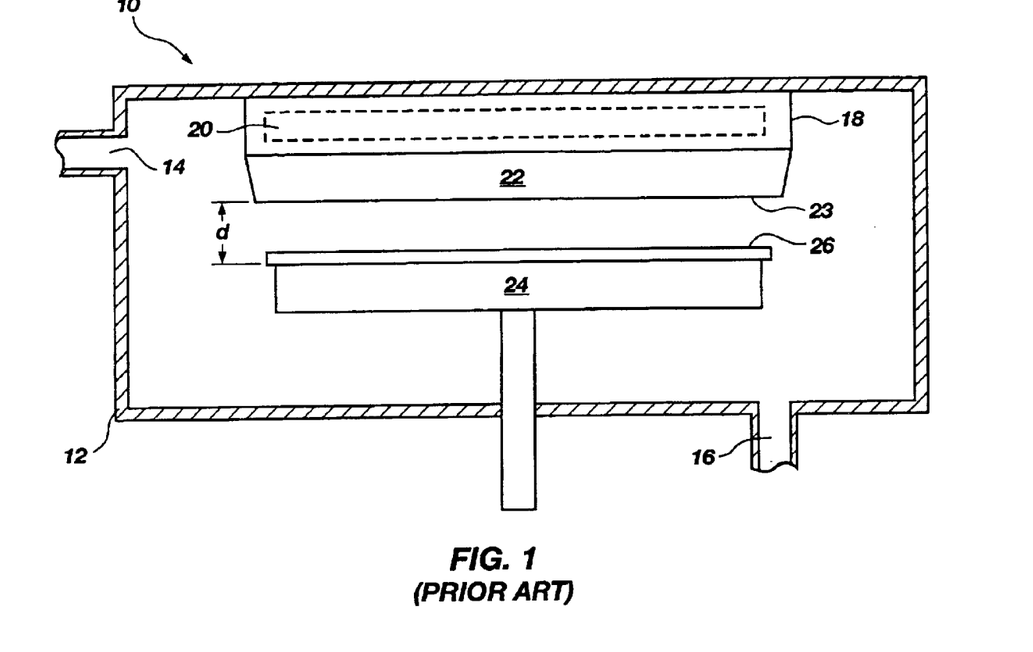
FIG. 1 is a cross-sectional side view schematic of a sputtering apparatus.

A thin film of metallic material may be deposited on a substrate using a sputter deposition process wherein a metallic target is attacked with ions causing atoms or small particles of the target to be ejected from the target and deposited on the substrate surface. FIG. 1 illustrates a cross-sectional schematic of a typical sputtering apparatus 10 comprising a vacuum chamber 12 having a gas inlet 14 and a gas outlet 16. The sputtering apparatus 10 further comprises a substrate support pedestal 24 and a metallic target 22 attached to a sputtering cathode assembly 18, each located within the vacuum chamber 12. The pedestal 24 may be configured to secure a substrate 26 thereto with a biasable electrostatic chuck, a vacuum chuck, a clamping structure, or a combination of methods. The substrate 26 may be transported to and from the pedestal 24 manually or with a robotic arm or blade (not shown).

During the sputtering process, the vacuum chamber 12 is filled with an inert gas, such as argon, through the gas inlet 14 and then reduced to a near vacuum through the gas outlet 16. The target 22 is negatively charged to cause electrons to be emitted from an exposed surface 23 of the target 22 and move toward an anode (not shown). A portion of the moving electrons strike atoms of the inert gas, causing the atoms to become positively ionized and move towards the negatively charged target 22. The electrons, inert gas atoms, and ions form a plasma which is typically intensified and confined over the target surface 23 by a magnetic field generated by a magnet assembly 20 located proximate the target 22. The magnet assembly 20 may comprise one or more permanent magnets or electromagnets located behind and/or to the side of the target 22. A portion of the ions discharging from the plasma strike the target surface 23 at a high velocity, causing atoms or small particles of the target 22 material to be ejected from the target surface 23. The ejected atoms or small particles then travel through the vacuum chamber 12 until they strike a surface, such as the surface of the substrate 26, forming a thin metallic film thereon.

Figure 2:
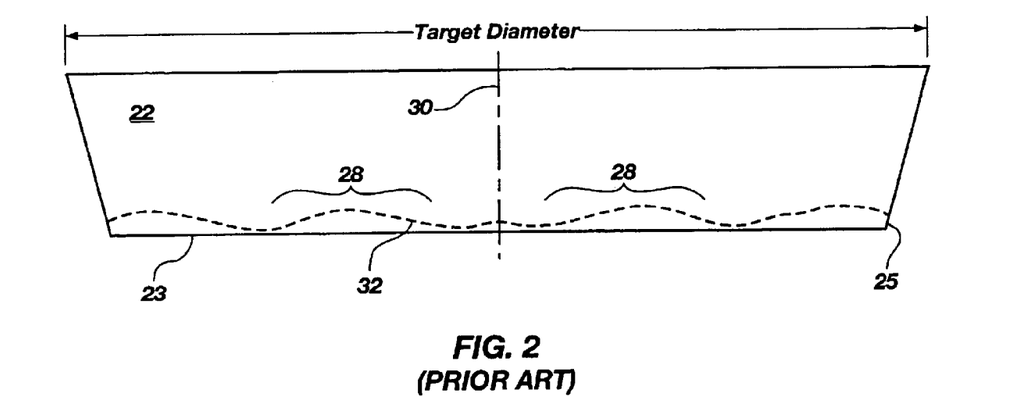
FIG. 2 is a cross-sectional perspective side view of an erosion profile of a cylindrical, metallic target.

The magnetic field formed over the target surface 23 by the magnet assembly 20 confines the electrons emitted from the target 22 to an area near the target surface 23. This greatly increases the electron density and the likelihood of collisions between the electrons and the atoms of the inert gas in the space near the target surface 23. Therefore, there is a higher rate of ion production in plasma regions near the target surface 23 where the magnetic field intensity is stronger. Varying rates of ion production in different plasma regions causes the target surface 23 to erode unevenly. Typically, the configuration of the magnet assembly 20 produces a radial variation of thick and thin areas, or grooves, within a diameter of the target surface 23. FIG. 2 illustrates a cross-sectional perspective view of a typical erosion profile of a cylindrical metallic target 22, such as the metallic target 22 shown in FIG. 1, which has been used in a sputtering process. FIG. 2 illustrates a target surface 23 before erosion has occurred as well as a target surface 32 that has eroded unevenly across the length of a diameter bounded by an outside edge 25 of the target 22. Due to the geometry of a magnetic field surrounding the target 22, the target surface 32 has eroded nearly symmetrically about a center line 30 dividing the length of the diameter.

Referring now to FIGS. 1 and 2, the target 22 may comprise a rare metal, such as gold, platinum, palladium or silver, or may comprise, for example, aluminum, titanium, tungsten or any other target material conventionally employed in the semiconductor industry. Therefore, it is advantageous to consume as much of the target 22 material during sputter deposition processes as possible before replacing an eroded target 22. Further, replacing an eroded target 22 before the end of its useful life may be a difficult and time-consuming task. However, it is important to replace the target 22 before a groove "punches through" the target 22 material and exposes portions of the cathode assembly 18 to erosion, causing damage to the cathode assembly 18 and contaminating the sputtering apparatus 10. For example, the target 22 material in the area of groove 28 shown in FIG. 2 may erode before the remainder of the target 22 material and expose the cathode assembly 18 to ionic bombardment from the surrounding plasma.

The useful life of a metallic sputtering target 22 is typically estimated by determining the cumulative deposition time for the target 22. A deposition time is chosen to guarantee that the target 22 material will never be completely removed at any given location and may take into account the thickness of the target 22, the material used for the target 22, and the effect of intensifying and confining the plasma over the target surface 32 by a magnetic field generated by the magnet assembly 20 in a predetermined configuration. However, if the characteristics of the plasma distribution change due to, for example, reconfiguring the magnet assembly 20 to produce a magnetic field with a different geometry, the erosion of the target surface 32 may be changed and could result in localized enhanced metal removal and the possible punching through to the cathode assembly 18 before the expiration of the estimated deposition time.

Directly measuring the target surface 23 is difficult and time consuming. Opening the vacuum chamber 12 to inspect the target surface 23 requires several hours of idle time while the vacuum chamber 12 is baked out under post-vacuum inspection. Accurate measurement of the target surface 23 while the sputtering apparatus 10 is under vacuum is difficult because the gap distance d between the target 22 and the pedestal 24 may be as small as 25 millimeters. Typical measurement devices are too large to be inserted into the gap d between the target 22 and the pedestal 24 to profile the target surface 23 while the vacuum chamber 12 is under vacuum. Further, measurement devices placed near the target 22 during a sputtering process may be damaged by exposure to metal deposition.

In view of the shortcomings in the art, it would be advantageous to prevent premature replacement and overconsumption of the target 22 by providing a technique and device to measure the target surface 23 while the vacuum chamber 12 is under vacuum.

BRIEF SUMMARY OF THE INVENTION

The present invention relates to methods and apparatus for measuring the erosion of a metallic sputtering target.

An apparatus according to one embodiment of the present invention comprises a sensor configured to emit an energy beam toward a target surface and to detect a reflection of the energy beam from the target surface. The sensor may be coupled to a thin profile arm configured to move or transport the sensor over the target surface between the target and a substrate support pedestal to a plurality of measurement locations. The arm may be configured to attach to a robotic device. The sensor and the arm are configured, positioned and sized to be inserted into a narrow gap existing between the target surface and the pedestal. The arm may also be configured to remove the sensor from the gap and to shield the sensor during a sputtering process.

In another embodiment of the present invention, the sensor comprises a source element configured to emit a collimated light beam and a plurality of detectors arranged in a linear array. The source element may be positioned so as to emit the collimated light beam at an acute angle with respect to the linear array of detectors. The detectors are positioned relative to the source element so that one of the detectors in the array will be illuminated by a reflection of the collimated light beam. The distance from the sensor to the target surface or the percentage of target erosion may be calculated by determining which detector in the array is illuminated by the reflection of the collimated light beam.

In a further embodiment of the present invention, the sensor comprises a transmitter optically coupled to a source collimator configured to collimate a light beam as it exits an optical fiber. The sensor may further comprise a receiver optically coupled to a plurality of collection collimators, each of the plurality of collection collimators being configured to collect the reflection of the light beam incident thereon into a corresponding optical fiber.

The present invention also encompasses a sputter deposition system incorporating the sensors of the present invention and a method of profiling a sputtering surface target. The method comprises emitting an energy beam, illuminating a first location on the target surface, detecting a reflection of the energy beam from the at least one location, and analyzing the detected reflection of the energy beam to determine a distance from the point of emission to the first location.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

The drawings, which illustrate what are currently considered to be the best modes for carrying out the invention.

DETAILED DESCRIPTION OF THE INVENTION

Figure 3:
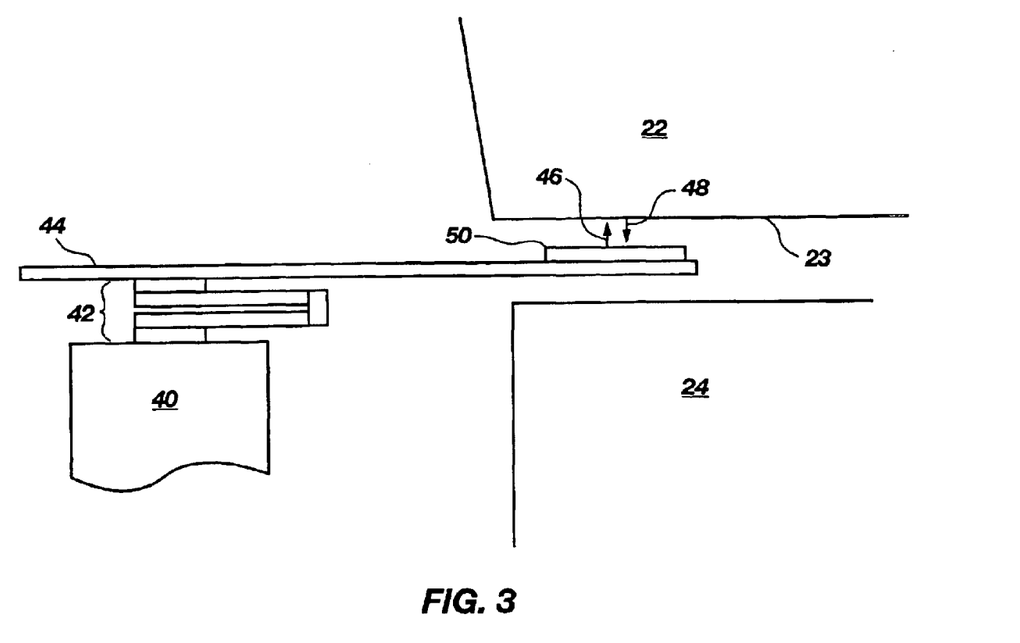
FIG. 3 is a cross-sectional side view schematic according to one embodiment of the present invention of a portion of a sputtering apparatus comprising a sensor configured, sized and positioned to be inserted between a target surface and a pedestal.

FIG. 3 illustrates a cross-sectional schematic of a portion of a sputtering apparatus, such as the sputtering apparatus 10 shown in FIG. 1, according to one embodiment of the present invention. As shown in FIG. 3, a sensor 50 coupled to a thin profile arm 44 is configured and sized to be inserted into a gap between a target 22 and a pedestal 24. The arm 44 may be configured to detachably attach to a chamber robot 40 configured to translate the sensor 50 over the target surface 23, or at least a portion thereof. The chamber robot 40 may further be configured to protect the sensor 50 during the sputtering process by removing the sensor 50 from the sputtering area or by shielding the sensor 50. The arm 44 may be interconnected to the chamber robot 40 through an articulating arm 42 configured to provide movement in at least one plane. In another embodiment of the present invention, the sensor 50 may detachably attach to a substrate pickup arm (not shown) connected to the chamber robot 40 and configured to transport a substrate (not shown) to and from the pedestal 24 using a pickup device (not shown), such as a clamp, vacuum chuck or electrostatic chuck, to attach the substrate thereto. In yet another embodiment, the sensor 50 may be configured to attach directly to the pickup device.

The sensor 50 is configured to transmit a signal 46 toward the target 22 and to receive a reflected signal 48 from the target surface 23. The transmitted signal 46 may be an energy beam selected from the group comprising a visible light beam, an ultraviolet light beam, an infrared light beam, a radio frequency ("RF") beam, a microwave beam and an ultrasound beam. To determine the amount of erosion at any location on the target surface 23, the reflected signal 48 may be analyzed to determine a relative distance between the sensor 50 and the target surface 23. It may not be necessary to measure the relative distance between the sensor 50 and the target surface 23 at every point on the target surface 23. Due to the radial symmetry of the erosion of the target surface 23, it is only necessary to determine the relative distance between the sensor 50 and the target surface 23 at points located linearly between the center line 30 of the target surface 23 and an outside edge 25 of the target surface 23, as shown in FIG. 2. Thus, in measuring the relative distance between the sensor 50 and the target surface 23 approximately every ten millimeters linearly between the center line 30 and an outside edge 25 may provide sufficient resolution to prevent punching through a target 22 having a diameter of approximately thirty centimeters.

In one embodiment of the present invention, the relative distance between the sensor 50 and the target surface 23 is measured by measuring the time delay between the emission of the transmitted signal 46 and detection of the reflected signal 48, multiplying the measured time delay by the speed of the transmitted signal 46 and dividing by two. To profile the target surface 23, the chamber robot 40 may be configured to position the sensor 50 at a plurality of locations relative to the target surface. Further, the sensor 50 may be configured, such as by using a multiplexor, to scan a portion (as opposed to a single point) on the target surface 23 while positioned at one location relative to the target surface 23. In another embodiment, the distance between the sensor 50 and the target surface 23 may be determined by indirectly establishing the time delay by measuring a phase difference between the transmitted signal 46 and the reflected signal 48.

In a phase measurement sensor 50, the transmitted signal 46 may comprise a modulated signal. In yet another embodiment, the transmitted signal 46 may be a pulsed signal and the reflected pulse signal 48 may be detected only during a predetermined time window such that increased time delay between transmission and detection causes less of the pulse to be detected. Thus, the detected power level of the reflected pulse signal 48 is inversely proportional to the distance traveled. Other embodiments for measuring the distance between the sensor 50 and the target surface 23, as presently known in the art, may also be employed.

Figure 4:
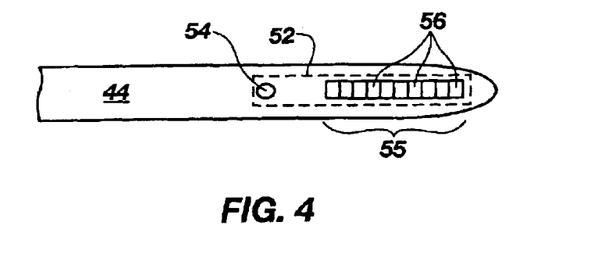
FIG. 4 is a top view schematic of a sensor according to one embodiment of the present invention.

FIG. 4 illustrates a top view schematic of a sensor 52 according to one embodiment of the present invention. The sensor 52 is attached to a thin profile arm 44, such as the arm 44 shown in FIG. 3. Sensor 52 comprises a source element 54 and a detector array 55. The source element 54 has a thin profile so as to fit between the target 22 and the pedestal 24, as shown in FIG. 3. The source element 54 is configured to generate a collimated light beam. By way of example only, and not by limitation, the source element 54 may comprise a laser diode. Alternatively, the source element 54 may comprise a collimator, such as a lens, configured to collimate or focus light exiting an optical fiber to a desired beam diameter or spot size. As will be seen below, the collimated light emitted from the source element 54 minimizes extraneous reflections and enhances signal detection. Use of a collimated light beam as an energy beam is currently preferred, although the invention is not so limited.

The detector array 55 comprises a plurality of detectors 56 (ten shown) disposed side by side in a linear array, each detector 56 having a thin profile so as to fit between the target 22 and the pedestal 24, as shown in FIG. 3. Each detector 56 in the detector array 55 is configured to produce an electronic sensory signal related to the magnitude of the radiation received thereon. By way of example only, and not by limitation, each detector may comprise a photodiode or a charge coupled device ("CCD"). Alternatively, each detector 56 in the detector array 55 may comprise a collimator, such as a lens, configured to collect light into an optical fiber.

Figure 5:
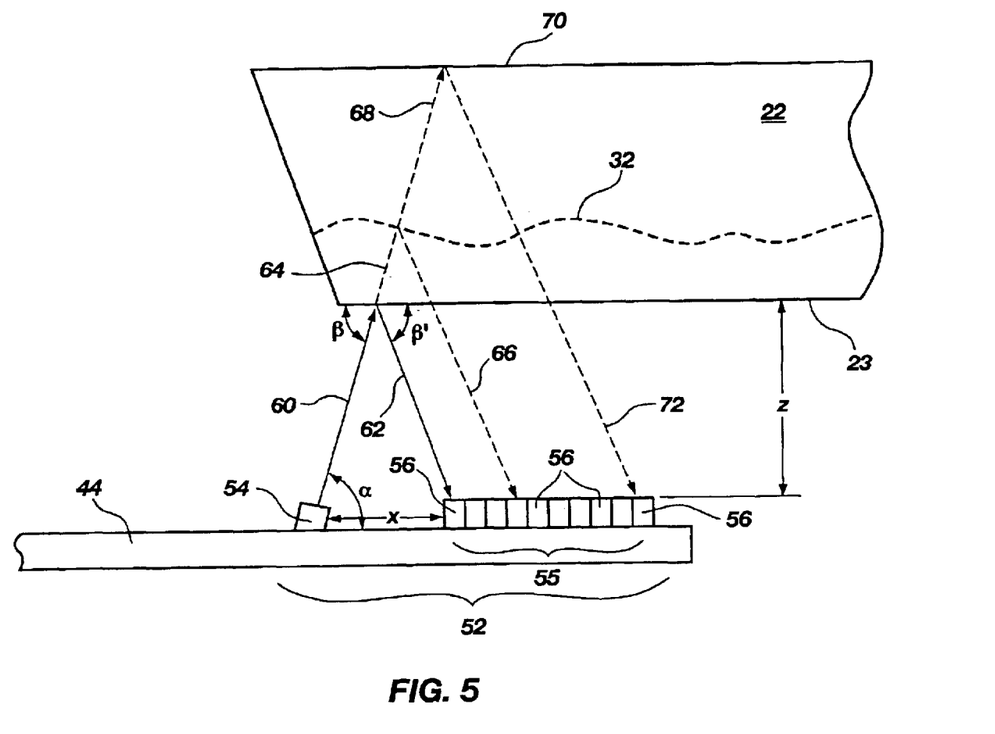
FIG. 5 is a side view schematic of the sensor of FIG. 4 and a portion of a sputtering apparatus.

FIG. 5 illustrates a side view schematic of the sensor 52 and arm 44 shown in FIG. 4. As shown in FIG. 5, the source element 54 is positioned so as to emit a transmitted beam 60 at a predetermined transmission angle a in relation to the arm 44. Although not shown, it may also be advantageous to position each detector 56 of the detector array 55 at an angle in relation to the arm 44 so as to align with a corresponding reflected beam, such as reflected beams 62, 66 and 72.

FIG. 5 also illustrates the sensor 52 positioned in relation to a portion of a target 22, such as the target 22 shown in FIG. 2. The number of detectors 56 in the detector array 55 and the position of each detector 56 relative to the source element 54 are dependent upon the distance between the sensor 52 and the target 22. For illustration purposes, three surfaces 23, 32, 70 are referenced in FIG. 5 corresponding to different target 22 erosion states. The first target surface 23 corresponds to a new or unused target 22 that has not yet been exposed to a sputtering process. The transmitted beam 60 illuminates the new target surface 23 and reflects back toward the detector array 55 as reflected beam 62. To configure the dimensions of the detector array 55, the vertical distance z between the new target surface 23 and the sensor 52 may be predetermined. Thus, assuming the incident angle β of the transmitted beam 60 and the reflected angle β' of the reflected beam 62 are equal, the distance x between the source element 54 and the nearest detector 56 in the detector array 55 (i.e., the detector 56 illuminated by the reflected beam 62) is given by:

$$x = 2\left(\frac{z}{\tan\alpha}\right) \quad (1)$$

The next target surface 32 shown in FIG. 5 corresponds to a target 22 that has been used in a sputtering process wherein approximately one-third of the target 22 material has been eroded. As discussed above in relation to FIG. 2, the target surface 32 has eroded unevenly. The transmitted beam 60, now represented by dashed line 64, illuminates the eroded target surface 32 and reflects back toward the detector array 55 as reflected beam 66. The reflected beam 66 illuminates a detector 56 in the detector array 55 located approximately one-third of the distance between the detector 56 located nearest the source element 54 and the detector 56 located farthest from the source element 54. Therefore, it may be determined that approximately one-third of the target 22 material has been eroded at the measured location along the target surface 32.

The next target surface 70 shown in FIG. 5 corresponds to the interface between the target 22 and the cathode assembly 18, as shown in FIG. 1. The transmitted beam 60, now represented by dashed line 68, illuminates the target interface surface 70 and reflects back toward the detector array 55 as reflected beam 72. The reflected beam 72 illuminates a detector 56 in the detector array 55 located farthest from the source element 54. Thus, it may be determined that substantially all of the target 22 material has been eroded at the measured location along the target interface surface 70. As discussed above, use of the present invention to detect target consumption prevents the target interface surface 70 from being punched through and exposing portions of the cathode assembly 18 to erosion from the sputtering process. Therefore, it may be advantageous to replace the target 22 before the target interface surface 70 is detected.

Figure 6:
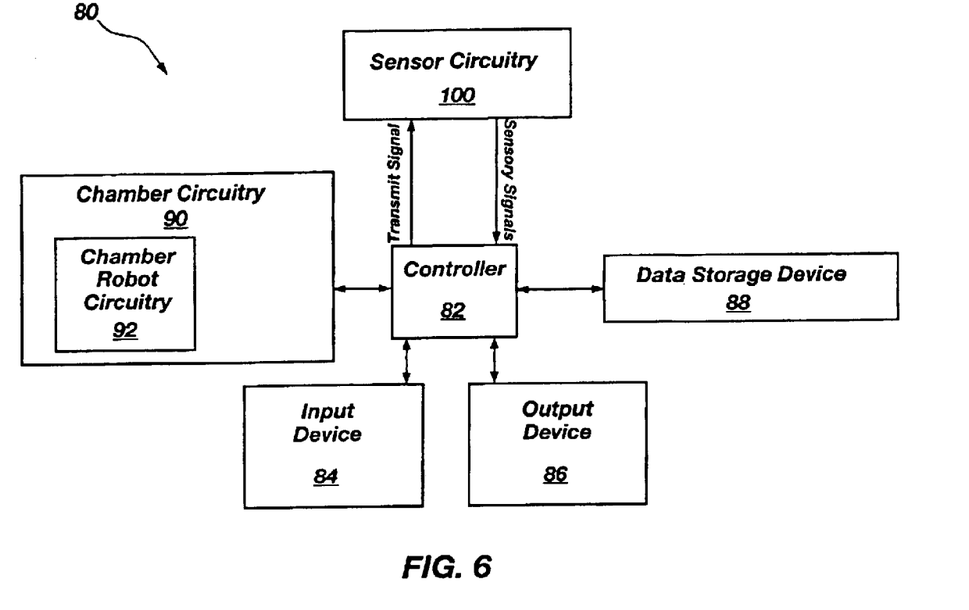
FIG. 6 is a block diagram of a sputter deposition system comprising a sensor assembly according to one embodiment of the present invention.

FIG. 6 is a block diagram of a sputter deposition system 80 according to the present invention. The sputter deposition system 80 comprises a controller 82 electrically coupled to chamber circuitry 90, sensor circuitry 100, an input device 84, an output device 86 and a data storage device 88. FIGS. 4 and 5 illustrate the sensor circuitry 100 comprising a sensor 52 attached to an arm 44, according to one embodiment of the present invention. The sensor 52 comprises a source element 54 and a plurality of detectors 56 (ten shown) forming a linear array 55. The controller 82 is configured to communicate an electronic transmit signal to the source element 54. Upon receipt of the transmit signal from the controller 82, the source element 54 is configured to transmit a beam of collimated light. The beam of collimated light may be a pulsed beam of collimated light. Each detector 56 is configured to generate an electronic sensory signal related to the magnitude of the radiation received thereon. The controller 82 is configured to receive and compare each of the sensory signals to determine which one of the detectors 56 was illuminated with the greatest magnitude of radiation. The controller 82 may be configured to receive the sensory signals during a predefined time window in relation to the communication of the transmit signal to the source element 54.

Referring to FIGS. 5 and 6, the controller 82 is further configured to determine the relative distance from the sensor 52 to a target surface 23, 32, 70. As described above in relation to FIG. 5, the controller 82 may be configured to estimate the relative amount of erosion at a location along the target surface 23, 32, 70 according to the relative position of the detector 56 in the detector array 55 illuminated with the greatest amount of radiation. For example, if a detector 56 located at the center of the detector array is determined by the controller 82 to be illuminated by a reflected beam, then the controller 82 may be configured to estimate that half of the target 22 material has been eroded at the position along the target surface 23, 32, 70 being measured. Alternatively, the distance from the sensor 52 to the target surface 23, 32, 70 may be determined as a function of the transmission angle α and the distance between the source element 54 and the detector 56 being illuminated. For example, if the transmission angle α and the distance x between the source element 54 and the nearest detector 56 in FIG. 5 are known, then equation (1) above may be used (assuming the incident angle β of the transmitted beam 60 and the reflected angle β' of the reflected beam 62 are equal) to determine the distance z between the sensor 52 and the target surface 23 as:

$$z = x\left(\frac{\tan\alpha}{2}\right) \qquad (2)$$

Figure 7:
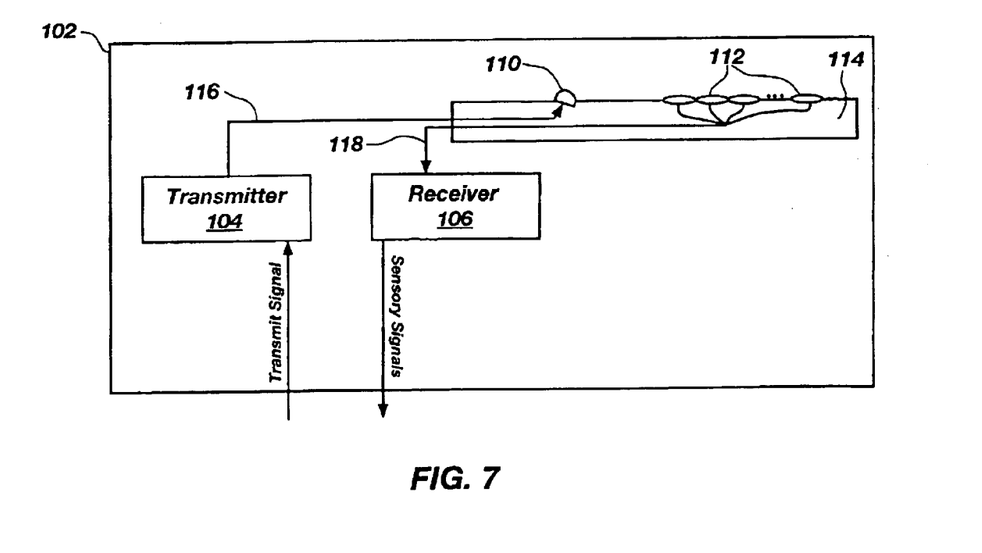
FIG. 7 is a block diagram of a sensor assembly according to one embodiment of the present invention.

FIG. 7 illustrates a block diagram of a sensor assembly 102, such as the sensor circuitry 100 shown in FIG. 6, according to another embodiment of the present invention. The sensor assembly 102 shown in FIG. 7 comprises a source element 110 and a plurality of reception elements 112 (four shown) attached to a thin profile arm 114, similar to the arm 44 shown in FIG. 3. The source element 110 comprises a collimator, such as a lens, configured to collimate or focus light exiting an optical fiber 116 to a desired beam diameter or spot size. Each reception element 112 comprises a collimator, such as a lens, configured to collect light incident thereon into an optical fiber assembly 118. The sensor assembly 102 further comprises a transmitter 104 coupled to the source element 110 through the optical fiber 116 and a receiver 106 coupled to each of the plurality of reception elements 112 through the optical fiber assembly 118. The optical fiber assembly 118 comprises a plurality of optical fibers, each optical fiber configured to couple to one reception element 112.

Referring to FIGS. 6 and 7, the transmitter 104 is configured to receive a transmit signal from the controller 82 and to transmit a beam of collimated light to the source element 110 through the optical fiber 116. The beam of collimated light may be a pulsed beam of collimated light. For each reception element 112, the receiver 106 is configured to receive a light beam through the optical fiber assembly 118 and to generate an electronic sensory signal related to the magnitude of the radiation collected at the respective reception element 112. The receiver 106 is further configured to transmit each of the sensory signals to the controller 82. The controller 82 is configured to receive and compare each of the sensory signals to determine which one of the reception elements 112 was illuminated with the greatest magnitude of radiation. The controller 82 may be configured to receive the sensory signals during a predefined time window in relation to the communication of the transmit signal to the source element 110. The controller 82 is further configured to determine the relative distance from the source element 110 to an object (not shown), as described above.

Referring to FIGS. 1 and 6, the controller 82 may be configured to interface with the chamber circuitry 90, including chamber robot circuitry 92, to control the position of the sensor circuitry 100 relative to a target 22 in the vacuum chamber 12, the placement and removal of a substrate 26 on the pedestal 24, sputter processing times, and other sputtering process and vacuum chamber 12 operations. The controller 82 may further be configured to perform computer functions such as executing software to perform desired calculations and tasks.

The input device 84 may include, by way of example only, an Internet or other network connection, a mouse, a keypad or any device that allows an operator to enter data into the controller 82. The output device 86 may include, by way of example only, a printer or a video display device. The data storage device 88 may include, by way of example only, drives that accept hard and floppy discs, tape cassettes, CD-ROM or DVD-ROM.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. An apparatus for measuring the erosion of a sputtering target surface, the apparatus comprising:
   a sensor configured to emit an energy beam toward the target surface and to detect a reflection of the energy beam from the target surface; and
   an arm coupled to the sensor, the arm configured to transport the sensor relative to the target surface.

2. The apparatus of claim 1, wherein the energy beam comprises one of a visible light beam, an ultraviolet light beam, an infrared light beam, a radio frequency beam, a microwave beam and an ultrasound beam.

3. The apparatus of claim 1, wherein the sensor is further configured to scan at least a portion of the target surface.

4. The apparatus of claim 1, further comprising a pedestal positioned proximate the target surface, wherein the sensor and the arm coupled thereto are configured, positioned and sized to enter a gap between the target surface and the pedestal, wherein the arm is further configured to transport the sensor into the gap without contacting the pedestal or target surface.

5. The apparatus of claim 4, wherein the arm is further configured to remove the sensor from the gap and to isolate the sensor from the target surface during a sputter deposition process.

6. The apparatus of claim 1, further comprising a robot configured to attach to the arm and to transport the arm relative to the target surface.

7. The apparatus of claim 6, wherein the robot is further configured to transport a substrate to and from a pedestal positioned proximate the target surface.

8. The apparatus of claim 1, wherein the arm is further configured to transport the sensor along a linear path over the target surface between a center of the target surface and an outer edge of the target surface.

9. The apparatus of claim 1, wherein the sensor comprises a plurality of detectors and a source element configured to emit the energy beam.

10. The apparatus of claim 9, wherein the plurality of detectors is disposed in a linear array.

11. The apparatus of claim 9, wherein each of the plurality of detectors is configured to generate an electronic sensory signal related to a magnitude of the reflection of the energy beam incident thereon.

12. The apparatus of claim 9, wherein each of the plurality of detectors comprises a collimator configured to collect the reflection of the energy beam incident thereon into a corresponding optical fiber.

13. The apparatus of claim 12, further comprising a receiver optically coupled to each collimator through its corresponding optical fiber, the receiver configured to generate an electronic sensory signal for each collimator related to a magnitude of the reflection of the energy beam incident thereon.

14. The apparatus of claim 9, wherein the source element is further configured to generate the energy beam.

15. The apparatus of claim 14, wherein the energy beam is a collimated light beam.

16. The apparatus of claim 9, wherein the source element comprises a collimator configured to collimate the energy beam as it exits an optical fiber.

17. The apparatus of claim 16, further comprising a transmitter optically coupled to the source element through the optical fiber, the transmitter configured to transmit the energy beam to the collimator.

18. The apparatus of claim 9, wherein the plurality of detectors comprises at least a first detector located in relation to the source element so as to be illuminated by the reflection of the energy beam when substantially none of the target surface has eroded at a location being measured.

19. The apparatus of claim 18, wherein the plurality of detectors comprises at least a second detector located in relation to the source element so as to be illuminated by the reflection of the energy beam when substantially all of the target surface has eroded at the location being measured.

20. The apparatus of claim 9, wherein the source element is configured to emit the energy beam at an acute angle relative to a disposition of the plurality of detectors.

21. A method for profiling a sputtering target surface, the method comprising:
    selectively positioning a sensor relative to a first location of the target surface;
    emitting an energy beam from the sensor;
    illuminating the first location with the emitted energy beam;
    detecting a reflection of the energy beam from the first location;
    analyzing the detected reflection of the energy beam to determine a distance from the sensor to the first location; and
    selectively positioning the sensor relative to a second location of the target surface.

22. The method of claim 21, wherein selectively positioning the sensor comprises moving the sensor with a robot.

23. The method of claim 21, wherein selectively positioning the sensor relative to the first location and the second location comprises successively positioning the sensor at two locations along a straight line positioned between a center of the target surface and an outer edge of the target surface.

24. The method of claim 21, wherein selectively positioning the sensor relative to the first location comprises inserting the sensor into a gap between the target surface and a pedestal positioned proximate the target surface.

25. The method of claim 24, wherein selectively positioning the sensor relative to the second location comprises removing the sensor from the gap.

26. The method of claim 21, wherein analyzing the detected reflection of the energy beam comprises:
    measuring a time delay between emitting the energy beam and detecting the reflection of the energy beam;
    multiplying the measured time delay by the speed of the emitted energy beam; and
    dividing by two.

27. The method of claim 26, wherein measuring the time delay comprises measuring a phase difference between the emitted energy beam and the detected reflection of the energy beam.

28. The method of claim 21, wherein analyzing the detected reflection of the energy beam comprises comparing a power level of the emitted energy beam with a detected power level of the reflection of the energy beam.

29. The method of claim 21, wherein emitting the energy beam comprises collimating the energy beam as it exits an optical fiber.

30. The method of claim 21, wherein detecting the reflection of the energy beam comprises:
    illuminating at least one detector of a plurality of detectors with the reflection of the energy beam, the plurality of detectors forming a linear array; and
    for each of the at least one detector, generating an electronic sensory signal related to a magnitude of the reflection of the energy beam incident thereon.

31. The method of claim 30, further comprising collecting a portion of the reflection of the energy beam into an optical fiber.

32. The method of claim 30, wherein analyzing the detected reflection of the energy beam comprises:
    comparing the electronic sensory signals;
    determining a position in the linear array of at least one detector illuminated with the greatest magnitude of radiation; and
    relating the array position to an amount of target erosion.

33. A sputter deposition system comprising:
    sensor circuitry configured to emit an energy beam toward a target surface and to detect a reflection of the energy beam from the target surface;
    an arm configured to attach to at least a portion of the sensor circuitry, the arm configured to transport the at least a portion of the sensor circuitry relative to the target surface; and
    a controller electrically coupled to the sensor circuitry, the controller configured to determine a distance from the at least a portion of the sensor circuitry to the target surface.

34. The system of claim 33, wherein the energy beam comprises one of a visible light beam, an ultraviolet light beam, an infrared light beam, a radio frequency beam, a microwave beam and an ultrasound beam.

35. The system of claim 33, wherein the controller is further configured to transmit a first electrical signal to the sensor circuitry and to receive a plurality of second electrical signals from the sensor circuitry.

36. The system of claim 35, wherein the sensor circuitry is configured to emit the energy beam upon receiving the first electrical signal from the controller.

37. The system of claim 35, wherein the sensor circuitry comprises a transmitter optically coupled to a collimator, the transmitter configured to receive the first electrical signal from the controller and to transmit the energy beam to the collimator upon receiving the first electrical signal.

38. The system of claim 35, wherein the sensor circuitry comprises a plurality of detectors configured to generate the plurality of second electrical signals, each of the plurality of second electrical signals being related to a magnitude of the reflection of the energy beam incident upon a corresponding one of the plurality of detectors.

39. The system of claim 35, wherein the sensor circuitry comprises a receiver optically coupled to a plurality of collimators configured to collect the reflection of the energy beam from the target surface, the receiver configured to generate the plurality of second electrical signals in relation to a magnitude of the reflection of the energy beam incident upon the plurality of collimators.

40. The system of claim 35, wherein the controller is further configured to analyze the plurality of second electrical signals to determine the distance from the at least a portion of the sensor circuitry to the target surface.

41. The system of claim 33, further comprising a pedestal positioned proximate the target surface, wherein at least a portion of the sensor circuitry is configured, positioned and sized to enter a gap between the target surface and the pedestal.

42. The system of claim 33, further comprising a robot operably coupled to the controller, the robot configured to move the arm relative to the target surface.

43. The system of claim 33, further comprising at least one peripheral device configured to electrically couple to the controller, wherein the at least one peripheral device comprises one of chamber circuitry, an input device, an output device and a data storage device.

* * * * *

UNITED STATES PATENT AND TRADEMARK OFFICE
CERTIFICATE OF CORRECTION

| | | |
|---|---|---|
| PATENT NO. | : 6,811,657 B2 | Page 1 of 1 |
| APPLICATION NO. | : 10/352699 | |
| DATED | : November 2, 2004 | |
| INVENTOR(S) | : Mark A. Jaso | |

It is certified that error appears in the above-identified patent and that said Letters Patent is hereby corrected as shown below:

In the specification:
COLUMN 5,   LINE 43,   after "angle" change "a" to --$\alpha$--

Signed and Sealed this

Eighth Day of May, 2007

JON W. DUDAS
*Director of the United States Patent and Trademark Office*